(12) United States Patent
Groneberg et al.

(10) Patent No.: US 9,417,281 B1
(45) Date of Patent: Aug. 16, 2016

(54) ADJUSTABLE SPLIT-BEAM OPTICAL PROBING (ASOP)

(71) Applicant: Checkpoint Technologies LLC, San Jose, CA (US)

(72) Inventors: Horst E. Groneberg, Pleasanton, CA (US); Guoqing Xiao, Saratoga, CA (US); Krishna Kuchibhotla, San Jose, CA (US)

(73) Assignee: CHECKPOINT TECHNOLOGIES LLC, San Jose, CA (US)

( * ) Notice: Subject to any disclaimer, the term of this patent is extended or adjusted under 35 U.S.C. 154(b) by 0 days.

(21) Appl. No.: 14/591,783

(22) Filed: Jan. 7, 2015

Related U.S. Application Data

(60) Provisional application No. 62/057,854, filed on Sep. 30, 2014.

(51) Int. Cl.
*G01R 31/311* (2006.01)
*G01R 31/309* (2006.01)
*G01R 31/308* (2006.01)

(52) U.S. Cl.
CPC ............ *G01R 31/311* (2013.01); *G01R 31/308* (2013.01); *G01R 31/309* (2013.01)

(58) Field of Classification Search
CPC ... G01R 31/308; G01R 31/309; G01R 31/311
See application file for complete search history.

(56) References Cited

U.S. PATENT DOCUMENTS

| | | | | |
|---|---|---|---|---|
| 4,298,283 A | * | 11/1981 | Makosch | ........... G01B 11/0608 356/495 |
| 4,758,092 A | * | 7/1988 | Heinrich | ............... G01R 31/308 324/754.23 |
| 5,610,718 A | * | 3/1997 | Sentoku | .............. G03F 7/70633 356/490 |
| 5,872,360 A | | 2/1999 | Paniccia et al. | |
| 5,905,577 A | | 5/1999 | Wilsher et al. | |
| 6,496,261 B1 | | 12/2002 | Wilsher et al. | |
| 7,224,828 B2 | | 5/2007 | Cotton et al. | |
| 7,227,702 B2 | | 6/2007 | Pakdaman et al. | |
| 7,466,852 B2 | | 12/2008 | Cotton et al. | |

(Continued)

OTHER PUBLICATIONS

U.S. Appl. No. 62/057,854, to Horst E. Groneberg, et al., filed Sep. 30, 2014.

*Primary Examiner* — Tung X Nguyen
*Assistant Examiner* — Adam Clarke
(74) *Attorney, Agent, or Firm* — Joshua D. Isenberg; JDI Patent

(57) ABSTRACT

A practical method for greatly enhancing the strength of the modulated signal from laser probing of IC's is described. An IC device under test (DUT) is scanned with two spatially separated laser beams. The output from a single laser source is split into two separate components with each focused on different areas of the DUT. The separation between the beams and their intensity is adjustable to maximize the strength of the modulated return signal. Typically a NIR laser is used with flip-chip IC devices to account for the band-gap (transmission) characteristics of the substrate material. Upon reflection from the DUT, the reflected beams are recombined to interfere with one another. The phase difference of the two beams is adjustable to gain maximum interference. This signal is then processed to obtain the waveforms that correspond to the actions of the active gates and nodes as the chip is electronically cycled through its prescribed test loop. This method significantly improves the signal to noise ratio and reduces the time it takes to acquire a useful voltage waveform.

23 Claims, 10 Drawing Sheets

(56) References Cited

U.S. PATENT DOCUMENTS

| | | |
|---|---|---|
| 7,492,529 B2 | 2/2009 | Pakdaman et al. |
| 7,616,312 B2 | 11/2009 | Kasapi et al. |
| 7,639,025 B2 | 12/2009 | Hanson et al. |
| 7,659,981 B2 | 2/2010 | Lo et al. |
| 7,733,100 B2 | 6/2010 | Kasapi |
| 7,990,167 B2 | 8/2011 | Kasapi |
| 7,990,543 B1 * | 8/2011 | Mello ................ G01B 11/2441 356/512 |
| 8,898,028 B2 * | 11/2014 | Kim .................... G01N 21/9501 702/155 |
| 2005/0122515 A1 * | 6/2005 | Borden ................ G01N 21/55 356/369 |

* cited by examiner

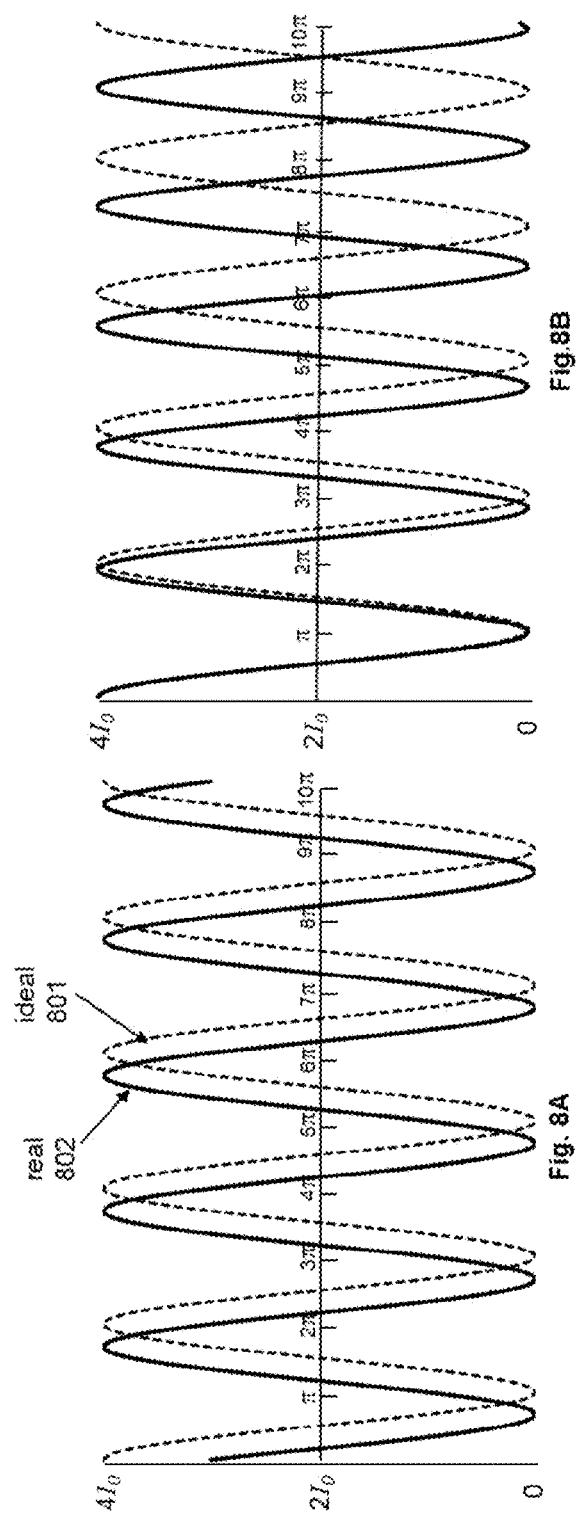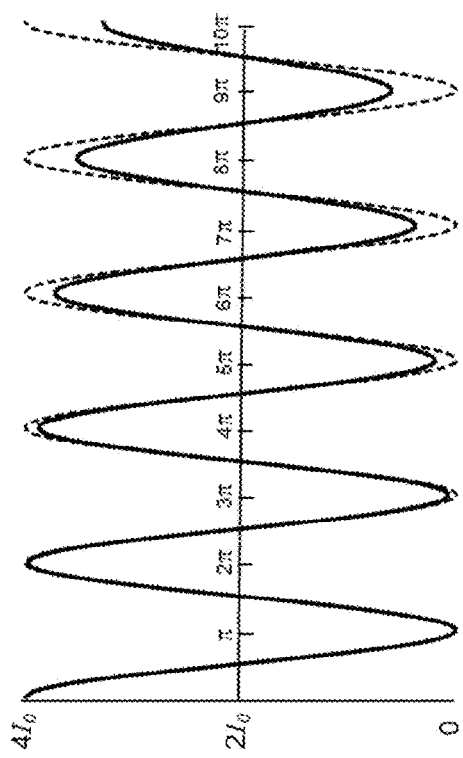

ADJUSTABLE SPLIT-BEAM OPTICAL PROBING (ASOP)

CLAIM OF PRIORITY

This application claims the priority benefit of U.S. Provisional Patent Application No. 62/057,854, filed Sep. 30, 2014, the entire contents of which are incorporated herein by reference.

FIELD OF THE DISCLOSURE

Aspects of the present disclosure relate generally to optical probing of semiconductor devices and more particularly to split beam optical probing.

BACKGROUND

Obtaining voltage, switching and timing measurements from currently manufactured CMOS and various IC's is now a standard procedure in debug and failure analysis of these complex devices. Since the introduction of flip-chip packaging technology, where access to the internal device structures is provided through the backside of the DUT, two optical methods, both non-destructive in nature, are typically used for measuring the electrical activity in IC's.

The first is known as Picosecond Imaging Circuit Analysis (PICA). Here a NIR sensitive camera or optical detectors such as avalanche photo diode is used in conjunction with the appropriate imaging optics to capture photons emitted by a circuit element as it switches logic states. The time-dependent light emission is used to obtain time resolved images of the switching events.

The second prevalent methodology is Laser Voltage Probing (LVP). LVP appears the currently preferred method for acquiring voltage and timing data from IC's. There are several improvements to LVP method that have been made. One such scheme employs two separate laser pulses which are focused to the same spot in DUT. One called the probe beam is used when the electrical circuit is active, and the other, called the reference pulse, is applied when the circuit is off. The two beams are displaced in time with respect to each other, but use a common optical path and sample the same physical location on the DUT. This cycle is repeated and the ratio of these two measurements taken again. By averaging multiple sets of ratios, the noise is reduced as compared to fluctuations inherent in a single measurement taken alone. FIG. 1 is a schematic illustration of the principles of one embodiment this technique. A laser light source 100 generates an incident beam 101. The incident beam passes through beam steering optics 150 that include a beam splitter cube 105 and a beam scanning module 115. The beam splitter cube 105, e.g., a polarizing beam splitter, diverts a portion of the incident beam to be sensed by an incident beam detector 110. The main component of the beam passes through the beam splitter cube 105 and into the beam scanning module 115. The beam scanning module may be programmed to raster scan or vector point the beam over a region of interest 121 on the device under test DUT 120. Probe beam optics 125 typically serves to focus the incident beam on an active area of the DUT, e.g., a switching gate of an IC. The incident beam, which in this case is also the probe beam, interacts with the electrically active region of the DUT and is modulated in amplitude as the voltage across the junction changes. Upon reflection, the returning laser light which now carries information encoded by the DUT, is captured by the probe beam optics 125 and relayed back along the incoming path. Upon arrival at a signal detector 130, the optical signal is converted to an electrical output, e.g., by an appropriately chosen fast photodiode and in conjunction with analog to digital conversion electronics, the signal is further processed by an oscilloscope 135 or similar signal processing electronics displaying an averaged voltage waveform. A synchronization circuit 140 handles various timing functions between the oscilloscope, the laser source and a test pattern generator 145. Further details on this system are described in U.S. Pat. No. 5,905,577, which is incorporated herein by reference.

A further refinement of the preceding technique is shown in FIG. 2. Since the incident laser beam at the DUT not only undergoes amplitude changes but phase modulation as well, a Michelson type interferometer 200 is used to capture this additional phase information as a change in amplitude that can be measured. This scheme is sometimes referred to as Phase Interferometric Detection (PID) mode. In this mode, a portion of the incident laser beam is picked off by a beam splitter 210. This portion is referred to as the reference beam. The interferometer 200 further includes a reference arm containing a lens 220 and mirror 230. The remaining portion of the incident beam is directed to a specific area of interest on the DUT. This portion is sometimes referred to as the probe beam. On reflection from the DUT the probe beam is modulated by the response of the DUT. The light beam 250 reflected by the DUT and the light beam 260 reflected by the reference arm mirror 230 are then spatially combined into the return beam 270 that now contains interference effects. The interference effects convert relative phase differences between the reflected beam from the DUT 240 and the reference arm beam 260 into amplitude differences in the combined return beam 270 which can be detected by a photo detector. Further details of the technique illustrated in FIG. 2 may be found in U.S. Pat. No. 6,496,261, which is incorporated herein by reference.

Another variation on the LVP method is called Polarization Differential Probing (PDP). Here the incident laser beam is divided into two beams each having orthogonal polarization with respect to the other. One of the polarized beams is used as a reference, while the other is designated the probe beam. Both beams are superimposed on each other, and follow a common path to be simultaneously focused onto the same location on a DUT. As shown in FIG. 3, a linearly polarized laser beam 300 is incident upon a polarization rotator 310 that rotates the polarization of the beam through some chosen angle to enter beam dividing and recombining optics 320 to provide two orthogonally polarized, but superimposed beams 325 and 330. Both beams follow a common path through beam pointing optics 335 where they are directed to be simultaneously incident on the same spot on the DUT 340. The interaction of the DUT with the laser beams is somewhat polarization dependent, and the phase of each is modulated differently according to the DUT test signals. The reflected light which contains this modulated component then retraces its incoming path and is made to interfere where the difference in phases converted to amplitude and sensed by detectors. Two separate detectors are provided to collect the orthogonal components from the two polarized beams. The signals are then passed on to collection electronics and a signal analysis system to extract the desired data. Further details of this technique may be found in U.S. Pat. No. 7,659,981 B2, which is incorporated herein by reference.

Yet another conventional technique used for phase detection, sometimes called Spatial Differential Probing (SDP) is illustrated in FIG. 4. A laser beam 405 is split into two component beams 420, 430 having mutually orthogonal polarization, e.g., by a Wollaston prism, which is located within beam manipulation optics 410. The two beams 420 and 430 have orthogonal, linear polarization states shown by dots in beam 420 and arrows in beam 430. One beam, e.g. 420, is directed to a first region 421 of the DUT, e.g., an active device region, while the other beam, e.g., 430 can be directed to a second region 422. Upon reflection of the two beams, beam manipulation optics 410 recombines to two reflected beams and converts them to the same polarization state so that they may interfere with each other to generate amplitude modulated resultant beam 440. The beam manipulation optics 410 may also include elements to provide phase offset and/or recombination of the returning beams. The phase noise due to DUT vibrations is reduced in this scheme because both beams are modulated similarly.

In this arrangement the separation between the beams is fixed. Since the geometry of various DUTs is not standard and depends upon its internal design and by the manufacturers' choices, a practical system must offer adjustability for separation of the beams. Also since the reflectivity of the area where the beams are placed can differ, a practical system must have adjustability of power for both beams to obtain best results. Examples of such systems are described, e.g., in U.S. Pat. Nos. 5,872,360, 7,616,312 B2, and 7,659,981 which are incorporated herein by reference.

A major difficulty remains with all laser based probing systems in that the signal is weak and needs separation from residual noise. The typical modulated intensity lies in the range of 100 to 200 parts per million (~0.01%), requiring considerable time and instrumental capacity for signal averaging. To acquire a waveform with good edge definition, in practice takes from several minutes to an hour or more depending on the DUT design. Tying up equipment for such a long time places a considerable constraint on the output capacity of a semiconductor test facility.

It is within this context that aspects of the present disclosure arise.

BRIEF DESCRIPTION OF THE DRAWINGS

Aspects of the present disclosure will become apparent upon reading the following detailed description and upon reference to the accompanying drawings in which:

FIGS. 8A-8C are graphs depicting three example cases in schematic, the influence of the externally induced phase on the ideal modulation plot. Any such deviations could provide a potential diagnostic tool in applications such as IC fault analysis.

DETAILED DESCRIPTION

Introduction

Figure 1:
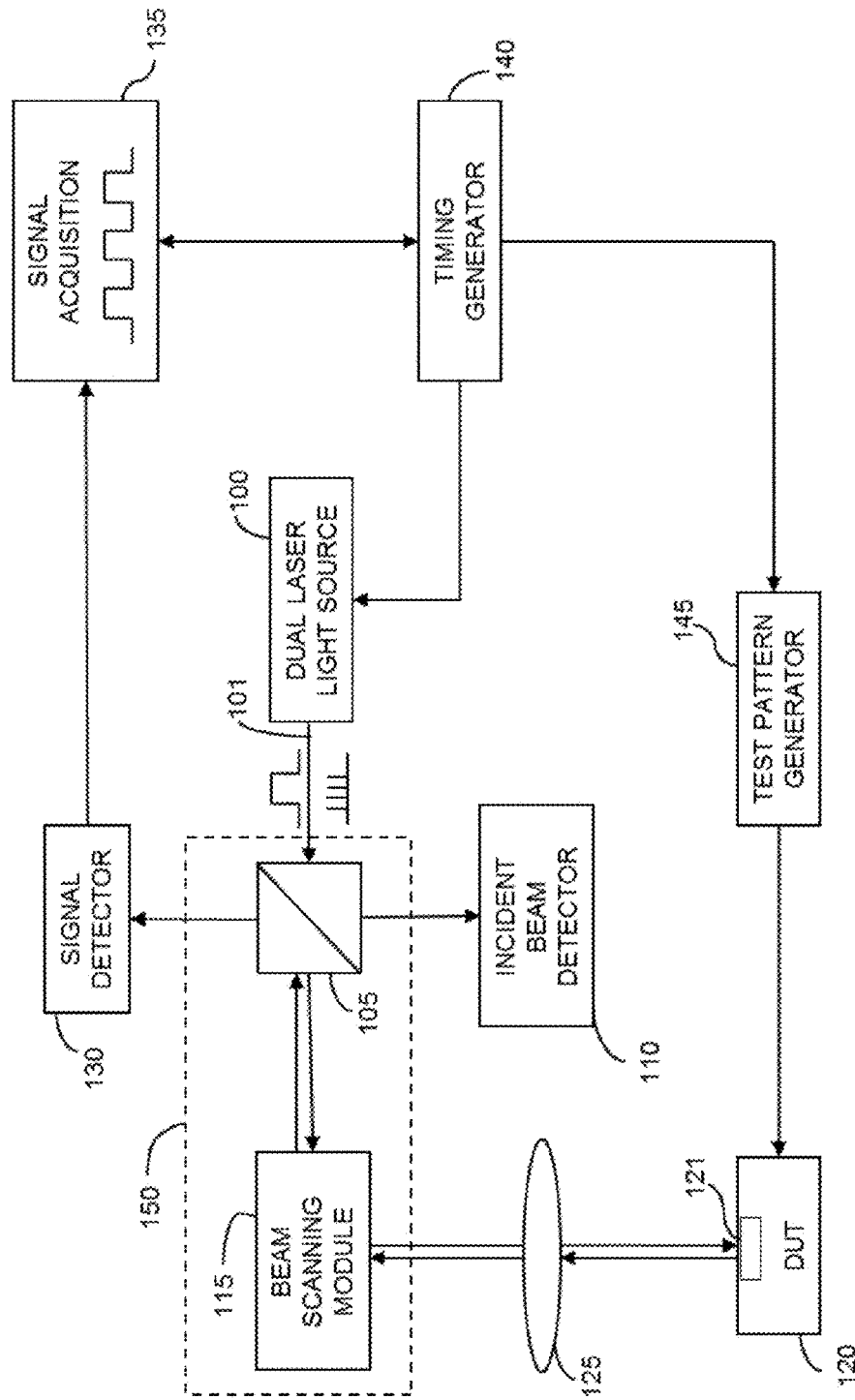
FIG. 1 is a schematic illustration of a prior art LVP system.
Figure 2:
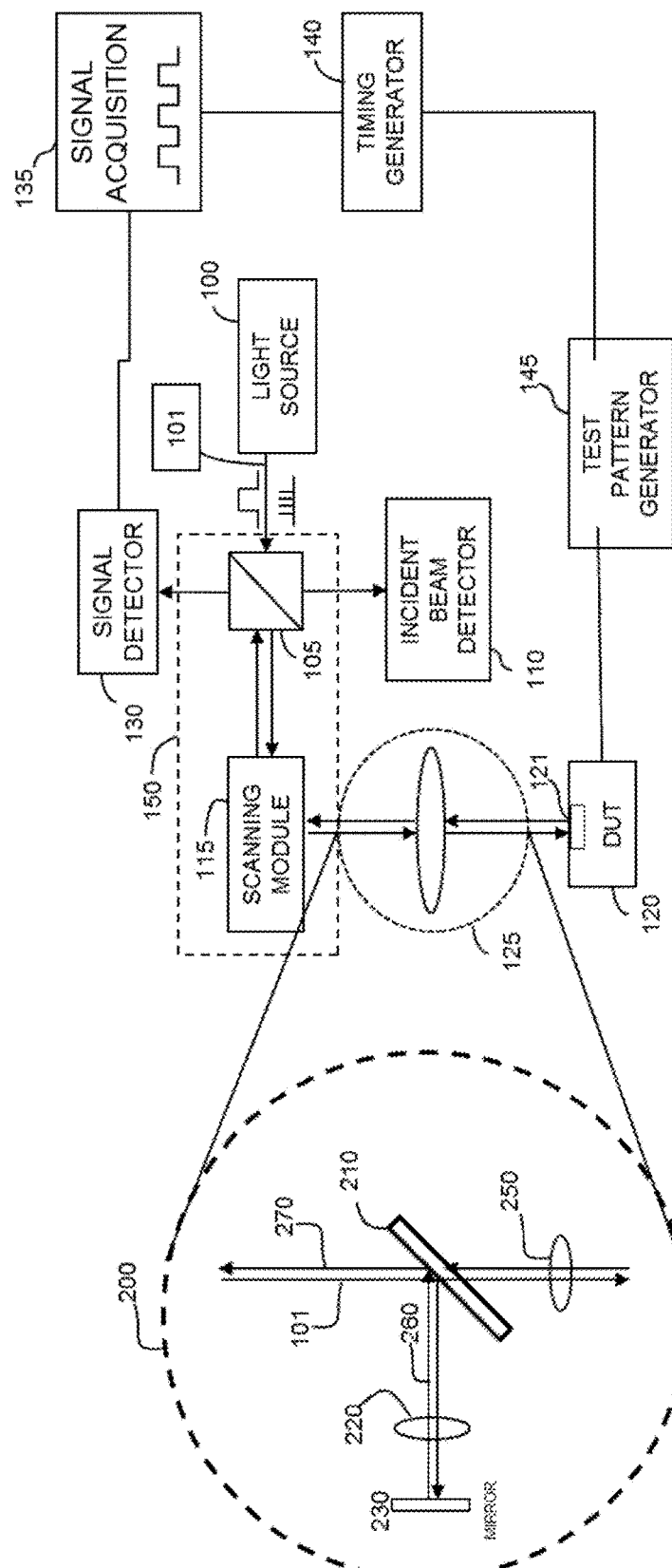
FIG. 2 is a schematic illustration of another prior art PID version of system illustrated in FIG. 1
Figure 3:
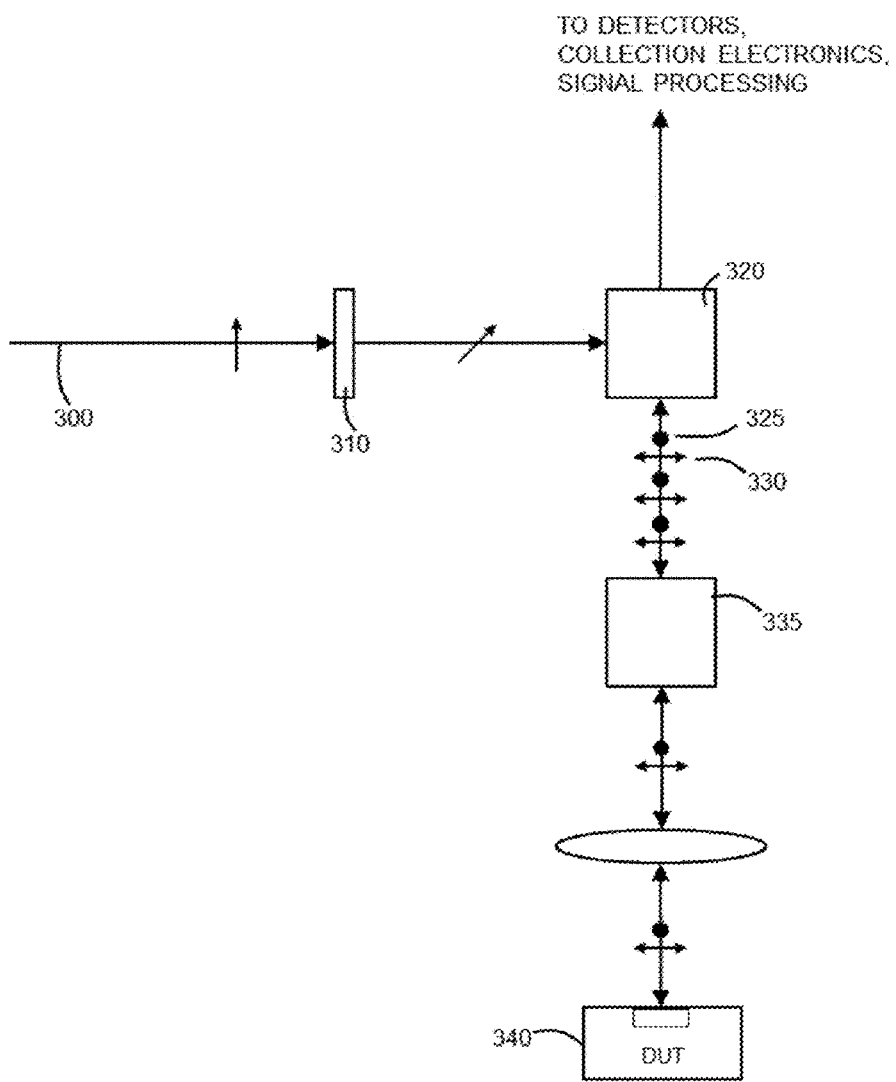
FIG. 3 is a schematic illustration of a prior art based Polarization Differential Probing (PDP) system.
Figure 4:
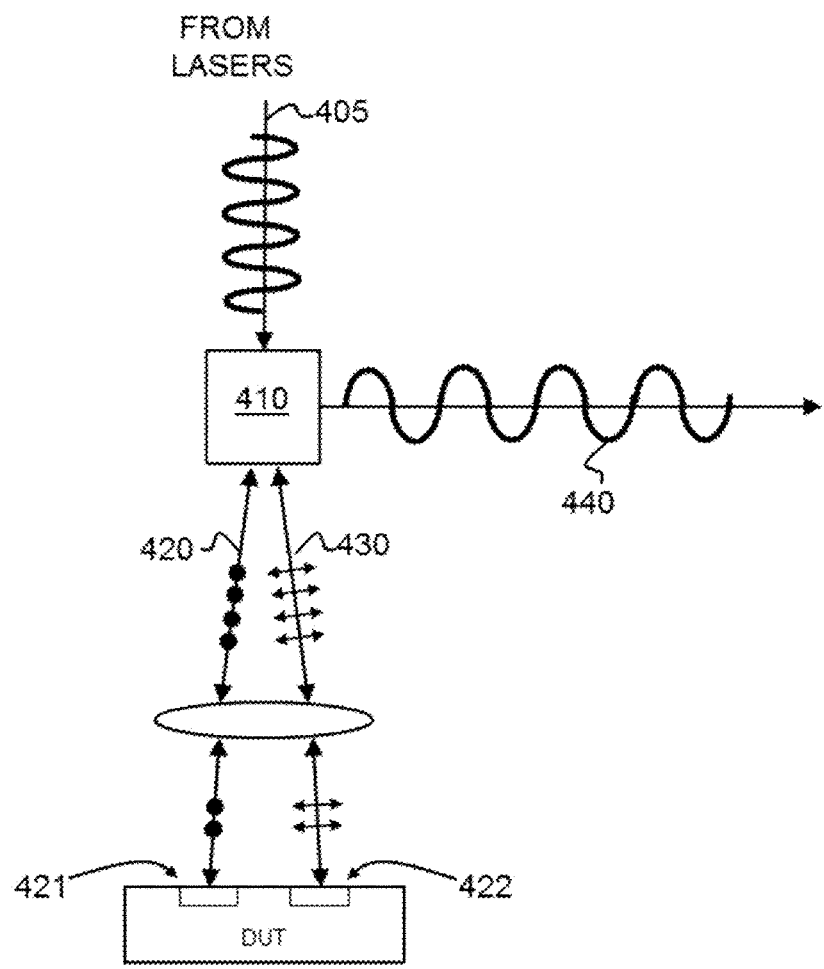
FIG. 4 is a schematic illustration of a prior art Spatial Differential Probing (SDP) system.

The technique presented here is novel in reducing signal acquisition time during the laser probing process of a DUT. The method scores some important advantages over prior art in improved throughput by reducing the amount of signal averaging needed, besides providing reliability and simplicity in architecture. A laser beam from a single laser source is split into two beams by optical means, each resultant beam is linearly polarized but in orthogonal directions. One of the beams, called a probe beam, travels along the optical systems axis and is focused onto an active IC structure. The other beam, called the reference beam, is laterally displaced by a small amount from the probing beam so that its focus falls on an adjacent, typically inactive area of the IC. Upon reflection from the device, both beams retrace the reverse path through the optical system and through the split beam generating section where both beams are recombined. Upon further beam conditioning, a detector then measures the intensity fluctuations due to interference of the recombined beams and stores that data as a time-varying signal.

Unlike prior art, this suggested technique is capable of controlling the separation between the probe and reference beam focal spots on the DUT. This important feature is highly desirable in applications such as failure analysis of ICs in which the device spacing varies. Additional key features include the ability to control the relative phase of the probe and reference beams and the ability to control the relative intensity of the input probe and reference beams for optimum signal modulation, and simultaneously prevent potential laser damage to the DUT from overexposure. The contemporary literature does not talk about these features in the context of SDP.

Variable separation of the probe and reference beams allows for optimal placement to obtain a modulated signal. Since the device structures vary in size according to the type of DUT, controlling the placement of the probe and reference beams becomes important. If, for example, the mirrors in the beam splitting apparatus are aligned in the null position, both beams are aligned and coincident with each other and both will come to focus at the same spot in the DUT. As the reference mirror is tilted with respect to the optics axis, the focal point of the reference beam will be laterally displaced from the probe beam. This unique feature enables the ability to adjust the separation between the probe and reference beam foci on DUT to acquire optimum signal modulation even across different layouts and dimensions of ICs. Also, vibration induced noise is also mitigated by parking the reference beam nearby on the DUT structure. At the DUT probe regions, a portion of both incident beams are reflected and the energy collected and precisely retraced through the telecentric optical system. Upon passing through the beam separating optics in the reverse direction, the beams are recombined and focused on a detector that senses the modulation signal.

According to another aspect of this disclosure, the optics may be configured such that the amplitudes of the return beams are the same, which is often the condition for best signal modulation. Since the energy of the reflected beams is dependent on the DUT's composition at the respective focal points and on its electrical state, their amplitudes may not optimally match. This can be corrected with an optical modulator configured to change the ratio of amplitudes in both beams. In some implementations, the optical modulator may be a ½ wave plate through which both beams pass. Rotating the ½ wave plate changes the ratio of the amplitudes of the two beams. Alternatives to a ½ wave plate include a Faraday rotator, an electro-optic (EO) rotator, two rotatable polarizing elements (e.g., two polarizing beam splitter elements). An EO rotator has the advantage of being faster. As this is done, the polarization angle of the incoming beam changes, and more energy can be diverted into the probe beam and less to the reference, or the reverse, more energy can be launched into the reference beam and less so into the probe beam. As further explanation, if the polarization vector of the incoming beam is rotated so that it strikes the hypotenuse of a polarizing beam splitter (PBS) in the P-polarized state only, all the laser beam energy will pass into the probe beam. If the polarization vector is rotated so that it will strike the hypotenuse in the S-polarization state, all the energy will go into the reference beam. These are the extreme states and the most likely adjustment will probably lie somewhere in between.

Further according to another aspect of the disclosure, the intensity of the incident laser beams should be controlled to prevent laser damage to the DUT. In this arrangement it is achieved by varying the laser input power before the beam enters the beam conditioning optics as described in the later part of detailed description. As the laser beam power is increased, the probe and reference beams both increase in equal proportion. Same holds when the laser power is decreased.

As can be seen from still another aspect of the disclosure, the phase difference between the probe and reference beams contributes to maximum modulation. Since the probe beam is phase shifted from its interaction with the active structures of the DUT, the optimum phase difference can be set and maintained by adjusting the mirror position along the optical axis within the beam separating apparatus.

Adjustable Split-Beam Optical Probing (ASOP) System

An adjustable split beam optical probing system according to certain aspects of the present disclosure will now be described, with reference to FIG. 5, in a manner that highlights the differences from prior art. Most particularly, a split beam module (SBM) 500 is used to generate two temporally coherent but spatially separated beams, which may be independently placed at separated locations anywhere on the DUT 505 within the field of view (FOV) of the imaging system. Other unique aspects of this invention will be noted in the description provided below.

Figure 5:
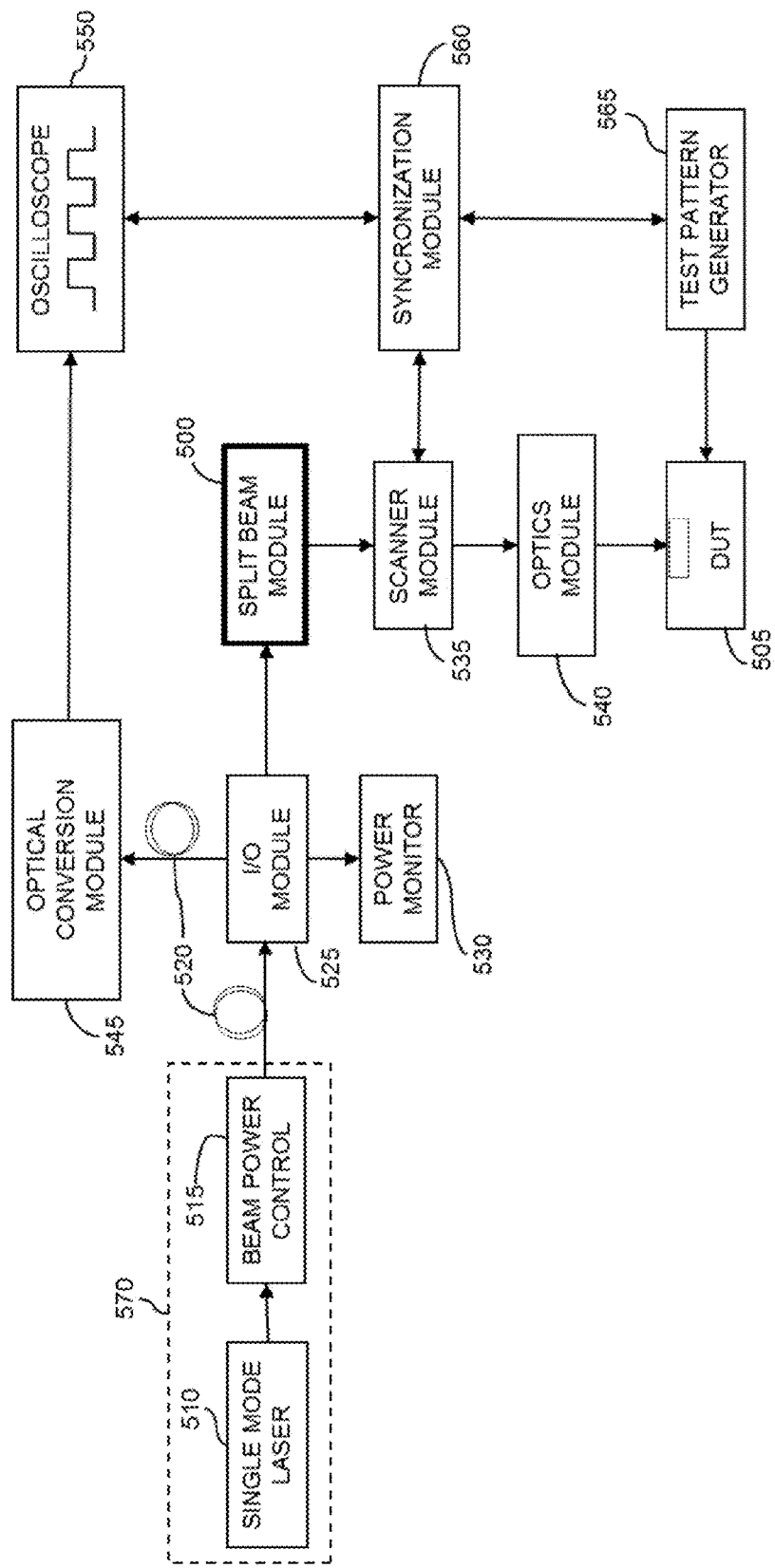
FIG. 5 is a schematic illustration of embodiment split beam optical probing system according to an aspect of the present disclosure.

In one aspect of the invention, as shown in the block diagram of FIG. 5, a light source control module LSC 570 having a narrow band light source 510 such as a single mode laser and controls for the output power BPC 515 provides a primary beam of radiation, which may be pulsed or continuous wave (CW). The wavelength of the radiation in the primary beam may vary, e.g., in a range from 900 nm to 1400 nm, with the choice of wavelength largely depending upon the material makeup and test parameters of the DUT. The light source 510 may also include two or more separate sources (e.g., two or more lasers) that produce beams of different wavelength that are optically coupled into a single output beam. Such an arrangement can provide the basis for automated control over wavelength selection. By way of example, and not by way of limitation, the light source 510 may be a single mode laser (SML) that provides a single mode, linearly polarized laser beam as the primary beam. Laser sources have been used in LVP techniques to obtain the interference phenomenon, due to the mutual coherence of phase information between the polarized split beams. On the other hand, mutually incoherent sources such as LEDs and white light suffer from random phase in time and do not interfere with each other. However, the split-beam concept described herein may be extended to other divisional properties of light sources such as amplitude, wavelength, or frequency of these incoherent sources and still make use of their associated modulation phenomena.

The primary beam from the light source 510 passes through the beam power control module (BPC) 515. The BPC controls and regulates the total power into the system and thus the probe beam to limit DUT exposure to below its damage threshold. In practice, the power level may be set by an operator via system controls. The BPC output then passes through a polarization maintaining fiber optic cable 520 that is coupled into the I/O module 525. Fiber optic coupling is used over direct beam coupling to provide more freedom in placing component and assemblies while incurring only minimal coupling losses. Within the I/O module, after further beam conditioning takes place, a small portion of the beam directed to the power monitor assembly (PMA) 530 and the main portion is passed into the SBM 500. Here the incoming beam is split into two orthogonally polarized components, one of which, called the 'probe beam', is directed along the optics axis to a scanner module (SM) 535 and optics module (OM) 540 to focus onto an active region of the DUT. The other, called the 'reference beam', undergoes a controlled and selectable small angular displacement with respect to the probe beam and follows a closely adjacent path through the SM and OM to focus onto the DUT 505 at a different location than the probe beam. Typically the separation of the focus locations for the probe and reference beams depends on the objective magnification, FOV and the level of telecentricity of the optics module 540. The separation could be anywhere between zero to a few tens of microns for high magnification objectives, such as 100× and solid immersion lens (SIL) objectives.

At the DUT 505, typically the probe beam undergoes reflectance and phase change in response to electrical interaction of the structure being probed. Portions of both incoming laser beams are then reflected back through the OM (also called collection optics) and the SM to retrace their path into the SBM to be spatially recombined. The beams exiting the SBM now overlap and have linear but orthogonal polarization states. Upon entering the I/O module, the polarization states are rotated so that components of each can optically interfere. The interfering components are transferred via fiber optic cable to the optical conversion module OCM 545 where the optical signal is transformed to an electrical voltage. An oscilloscope (OSC) 550 then acquires this signal and displays the corresponding voltage waveform. A synchronization circuit (SCM) 560 then coordinates the various timing functions of the test pattern generator 565, the GSM and OSC. For clarity the computer control connections are not shown.

Although FIG. 5 depicts optical fiber 520 to couple light from the beam power control module 515 to the I/O module 525, and from the I/O module 525 to the optical conversion module 545 aspects of the present disclosure are not limited to such implementations. Alternatively, these optical connections may be implemented in whole or in part, e.g., using free space optic components. Optical fiber connections are often advantageous, however, in terms of better component placement and portability.

A major distinction of aspects of the present disclosure from prior art, is the adjustable separation between probe and reference beams coming from the same light source and focused onto the DUT. This allows probing of ICs that usually have wide range of geometries of active and inactive nodes. The method of achieving adjustable separation of the beam is explained in the detailed description. By strategically choosing one of the components as a reference beam on an inactive node, the other component may be used for active probing the entire FOV. As an alternative technique, both beams can be made to scan together the entire the FOV with or without separation. The two orthogonally polarized reflected components are made to retrace their paths back in to split beam module 500 where they are recombined for enhanced modulation to obtain timing signal waveforms on detector. The same components used to split the laser beams for the illumination beam effectively works for their recombination in return. Besides, such separation adjustability between the reference and probe beams gives additional control to optimize and automate the signal acquisition process, as and when new IC architecture emerges for probing applications.

DETAILED DESCRIPTION

Figure 6A:
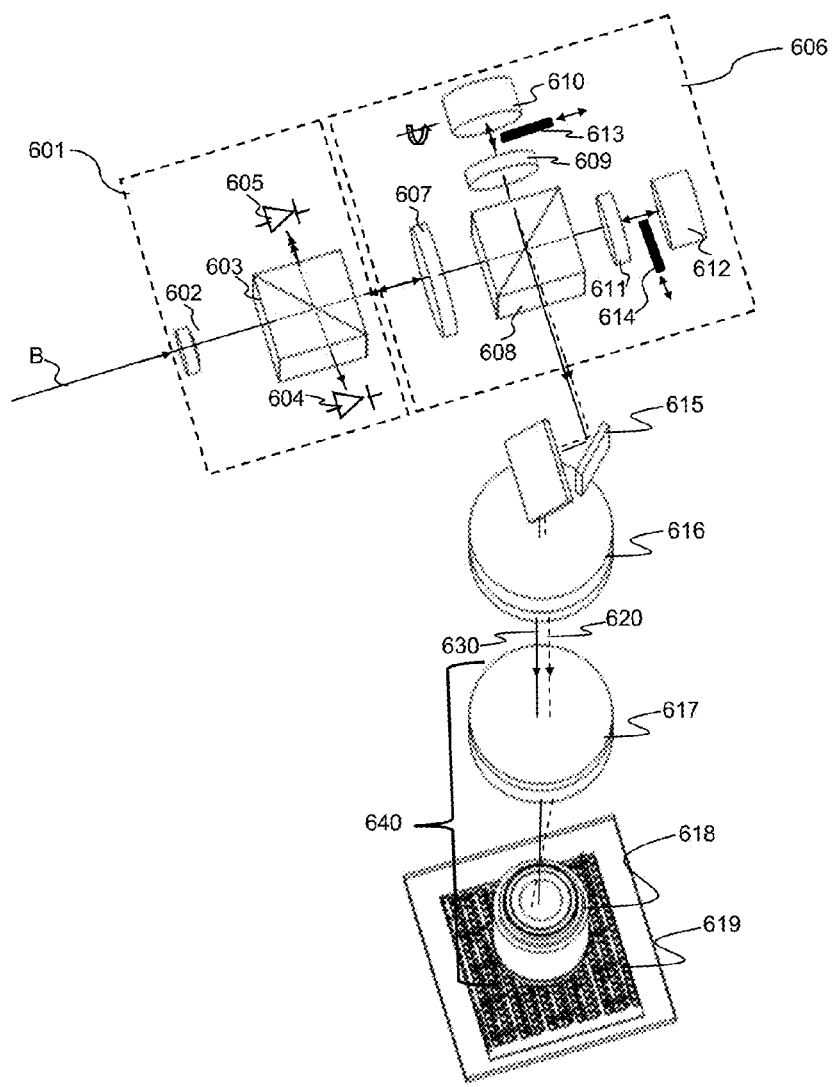
FIG. 6A is a three-dimensional schematic diagram of a split beam optical probing system according to another aspect of the present disclosure.
Figure 6B:
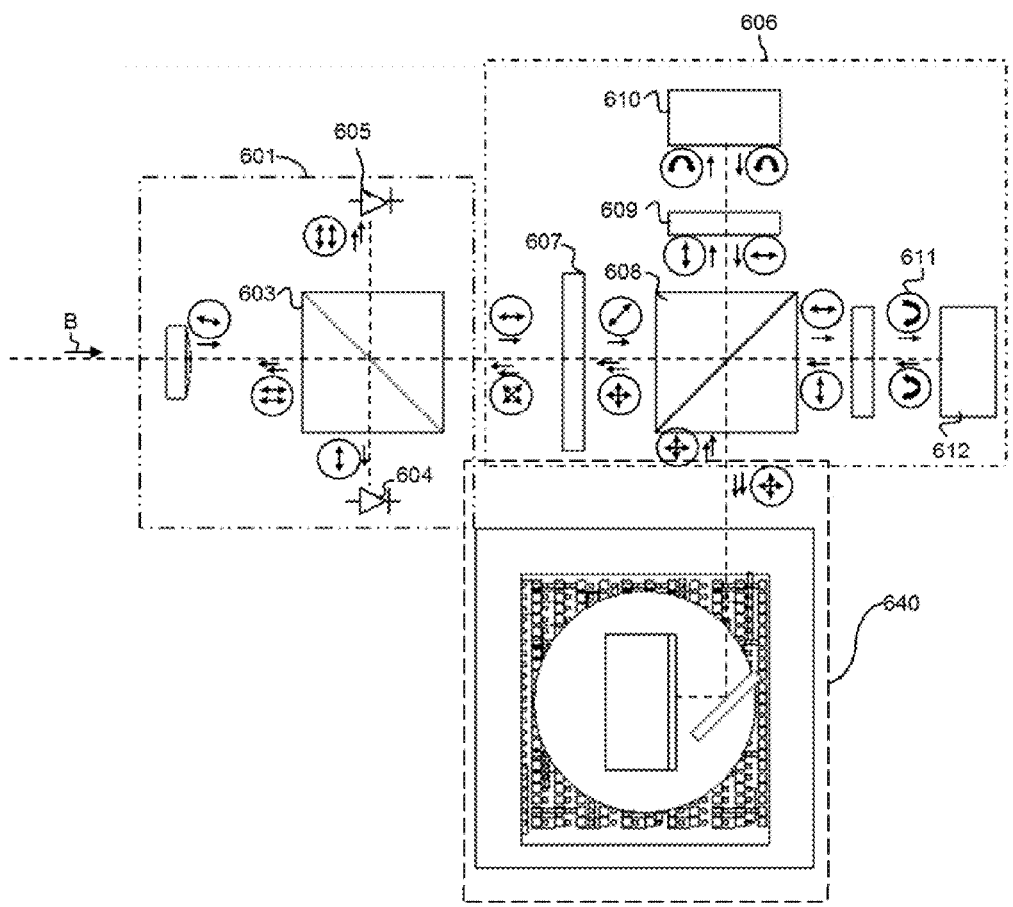
FIG. 6B is a schematic diagram illustrating a map of polarization transformations of probe and reference beams in incident and return paths in a split beam optical probing system according to an aspect of the present disclosure.
Figure 6C:
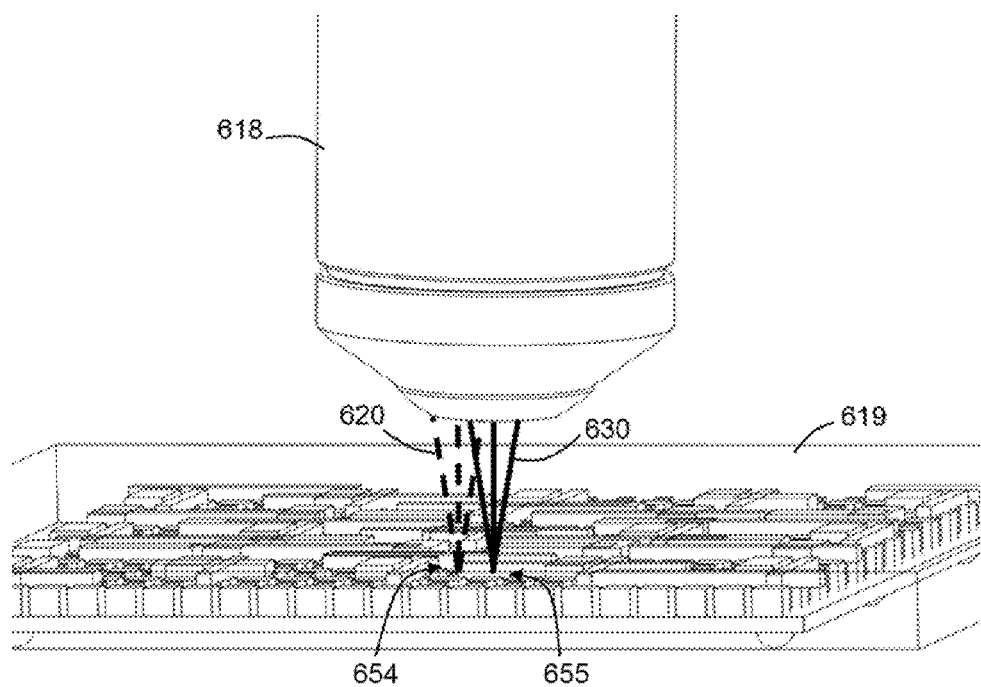
FIG. 6C is a three dimensional diagram illustrating probe and reference beams retracing their paths from a DUT in a telecentric imaging system.

A more detailed example of optics 600 compatible with the system of FIG. 5 is depicted in FIGS. 6A-6C. A single linearly polarized beam B, e.g., from the LSC module 570, may enter an I/O module 601. In this module, the beam B may be appropriately shaped by lens 602 and a small portion of the beam is picked-off by a first PBS 603 and sent to a power detector sensor and circuit 604. The major portion of the beam B passes through the first PBS 603 and enters a split beam module 606 containing a polarization rotator 607 and a second PBS 608. The polarization rotator 607 re-orients the linear polarization of the beam with respect to an incident angle upon the hypotenuse of the second PBS 608, which transmits a portion of the beam and reflects the remaining beam. The second PBS 608 separates the S and P polarization components of the beam B. One component, which makes up the probe beam 620, passes through a ¼ wave plate 609, is retro-reflected by an adjustable mirror 610, passes through the ¼ wave plate again, now having its polarization state rotated by 90 degrees, re-enters the second PBS 608 to pass straight through and then on to the imaging optics 640. The other component which makes the reference beam 630, also passes through a ¼ wave plate 611, is then retro reflected by a fixed mirror 612, passing through the ¼ wave plate again. Now having its polarization rotated by 90 degrees, the reference beam 630 is reflected by the second PBS 608 and follows a path more or less parallel to the optical axis through an imaging section 640. The imaging section includes a tube lens 617 and microscopic objective 618 that focuses the probe beam 620 and reference beam 630 onto the DUT at selected spatially separated test points. The probe and reference beam spots may be diffraction-limited at the target. Lateral separation between the probe and reference beam spots may be of order a few microns with simplified optics, but in theory the separation may be unlimited. A portion of the incident probe and reference beams are reflected at the focal position, the energy collected by the microscope optics and retraced through the microscope. Upon passing in the return trip through the split beam module 606, the beams are recombined and focused on an optical signal detector 605 that senses the modulation signal.

FIGS. 6A-6C schematically illustrate an example of optical components of a laser scanning microscope with built-in split beam module 606 that helps to execute the novel technique to split and recombine the laser components. While the description is focused on the illustrated layout, the concept can easily be extended to any other type of microscopic configuration used for laser signal acquisition, with minor changes. In brief, the illumination laser beam is spatially split by the split beam module 606 and used for scanning the DUT 619 as required. The figure illustrates an implementation that may be used in fault analysis of an integrated circuit (IC) on DUT with the help of a scanner and a microscope. The reflected beams from a DUT in a well configured telecentric system with altered amplitude and phase due to DUT structure retrace their paths and interfere to cause an amplified modulated signal in the signal channel.

As discussed above, the input beam B may be generated by a light source that may include a linearly polarized laser, an optical isolator, power control mechanism to prevent laser damage to the DUT, and a fiber delivery mechanism. The output of the light source with a slightly tilted horizontal polarization is shaped by lens 602 and is made to go through the first polarizing beam splitter (PBS) 603 oriented for suitable laser power distribution in both orthogonal directions on output. A small s-polarized component may be directed for power calibration to detector 604 while a significantly larger p-polarized component enters the split beam generator module 606.

The adjustable polarization rotator 607 rotates the polarization of the horizontally polarized component of the input beam B is by 45°. In the illustrated example, the second PBS 608 may split the beam B equally in power and send the two polarization components to two corresponding arms of the split beam module 610. Each beam encounters a quarter wave plate (609, 611) and a mirror (610, 612), flips its polarization and reenters the second PBS 608. As a result, the PBS 608 directs the orthogonally polarized probe and reference beams towards the scanner 615, which may include one or more adjustable tilt mirrors. In order to facilitate spatially adjustable reference and probe beams on DUT, the mirror (610 in this case) facing the scanner 615 may be piezo-controlled in both axial position and angle. A small amount of rotation of the adjustable mirror 610 generates the 'probe' beam 620 (dashed line) that undergoes an angular shift from the optical axis on exit from the PBS 608. The other beam component is usually kept confined to the optical axis is considered the 'reference' beam 630 (solid line). In some implementations, flip-in and flip-out physical stops 613 and 614 may be provided in each arm of the split beam module 606 to selectively work with either probe or reference beam for ease in their identification in assembly and special DUT investigations. As mentioned earlier, at a given instant of time, the probe and reference beams created by the split beam module 606 travels through the scanner 615, scan lens 616, tube lens 617 and the microscopic objective 618 and finally focus at two strategically identified positions on DUT with their spatial separation controlled by the piezo-guided mirror 610.

Such split beam can be used for probing IC devices may be understood by noting the transformation of beam polarization at various locations along the optical track for both illumination and return split beam. FIG. 6B illustrates the top view of same embodiment with details on the polarization status of the illumination and return split beam across the I/O module 601, split beam generator module 606, and scanner 615 and imaging optics 640. As discussed earlier, input polarization direction may be so selected to output most of the laser power to the split beam generator module 606, redirecting a small fraction towards power calibration with the help of a PBS 603. The polarization rotator 607, and second PBS 608 of the split beam generator module 606 together generate the probe and reference beams of orthogonal polarization with adjustable separation using quarter wave plates (609, 611) and mirrors (610, 612), at least one of which is adjustable. For the sake of simplicity, the discussion that follows describes an example in which one mirror (610) is adjustable and the other (612) is not. However, aspects of the present disclosure are not limited to such implementations. In alternative implementations, both mirrors 610, 612 may be independently adjustable in terms of axial position and tilt with respect to one or two dimensions. The split beams 620, 630 then travel through the scanner and imaging optics 640 to the DUT, where they are reflected by the DUT, follow a reverse path through the imaging optics and scanner and reenter the interferometer block with their respective same polarization states with or without some phase separation induced by DUT feature topography.

As may be noted, for the case when there is no tilt on the adjustable mirror 610 the split beam module 606 simply sends a beam of two superposed orthogonally polarized beams towards the scanner module. With a small tilt on the adjustable mirror 610, the reference beam separates out from the probe beam but travels along with a tilt that focuses spatially separated on DUT, after traversing the scanner 615 and imaging optics 640. Upon reflection from the DUT, the return probe and reference beams retrace their path back into the interferometer block with respective amplitude and phase modulations introduced by DUT features. The return probe and reference beams upon retracing their paths of the interferometer are closely realigned by PBS 608 and travel towards the I/O section 601. The beams are again rotated on passing through polarization rotator 607 before entering the first PBS in the I/O module 601. As a result, two beams of the same polarization, one from the probe beam and the other from the reference beam reflect off the hypotenuse surface of PBS 603 toward the optical signal detector 605 with relative amplitude and phase differences. The output of the optical signal detector 605 depends on these relative amplitude and phase differences.

FIG. 6C illustrates an example in which the imaging optics are telecentric. In this example, the split beam components, i.e., probe beam 620 and reference beam 630 from the imaging objective 618, fall normally on a first region 654 and second region 655 of a DUT 619. By way of example, and not by way of limitation, the first region 654 may be an inactive device or region of the DUT 619 and the second region 655 may be an active device or region of the DUT. Alternatively, the first and second regions may be selected for maximum sensitivity for modulation. For example, a phase difference may be induced due to the optical path difference between the probe and reference beams in the split beam generator module 606. In addition to this induced phase difference, the first and second regions may be selected, e.g., so that probing of an active device by the probe beam at the first region 654 with reference to probing another active device by reference the beam at the second region 654 introduces an additional phase difference. The induced phase difference may be adjusted so that the total relative phase difference is π/2 or an odd integral multiple of π/2, which would meet the condition for maximum sensitivity for modulation sensed by the optical signal detector 605.

The advantages of the split beam technique can be much appreciated by studying some theoretical aspects of the interfering return signal beam modulation characteristics as a function of the split beam separation. In the following, some theoretical facts supported by experimental findings are discussed for completion.

The resultant intensity of the recombined interfering beams in the signal module can be written as $$I = A_p^2 + A_r^2 + 2A_p A_r \cos(\alpha) \quad (1)$$

where $\alpha = \alpha_r - \alpha_p$ is the phase difference between reference and probe beams, $A_p$ and $A_r$ are the amplitudes of the probe and reference beams respectively and $\alpha_p$ and $\alpha_r$ being their phase components.

Equ.(1) can be rewritten as $$I = I_{avg}(1 + m \cos(\alpha)) \quad (2)$$

Where $I_{avg} = A_p^2 + A_r^2 = I_p + I_r$ is the average intensity and $$m = \frac{2\sqrt{I_p I_r}}{(I_p + I_r)}$$

is the contrast.

When $I_p = I_r = I_0$, $I_{avg} = 2I_0$ and m=1, and thus $$I = 2I_o(1 + \cos(\alpha)) \quad (3)$$

Equ.(3) illustrates the fact that the intensity can be as high as $4I_0$ (when $\alpha = 0, 2\pi, 4\pi, \ldots$) or as low as 0 (when $\alpha = \pi, 3\pi, 5\pi, \ldots$).

Such cases of perfect contrast is also often represented in interferometry as $$I = 4I_0 \cos^2\left(\frac{\alpha}{2}\right) \quad (4)$$

with high and low values of the interference intensity as $4I_0$ and 0, respectively. For incoherent sources $\alpha_p$ and $\alpha_r$ are random in time and the average $\cos(\alpha)$ term vanishes, causing no modulation. Similarly, single laser sources alone have only amplitude with no relative phase manipulation possible. In both cases, $I = I_{avg}$ =constant with no modulation possible. Subjecting I to its first derivative with respect to the phase difference α in Eq.(2), gives us the option for maximum sensitivity for modulation.

$$\delta I = -I_{avg} m \sin(\alpha) \delta \alpha \quad (5)$$

Figure 7:
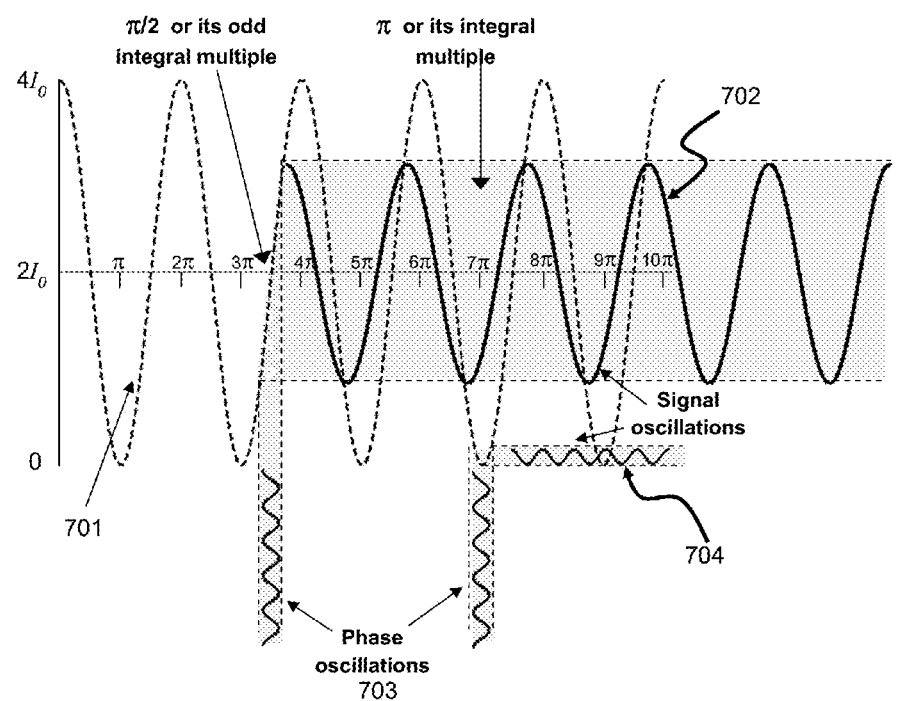
FIG. 7 is a graph illustrating typical signal modulation as a function of phase change induced by the split beam separation on DUT. The figure highlights the importance of the adjustability of the split beam separation to capture $\pi/2$ or its integral multiple equivalent phase differences that can provide maximum sensitivity to signal modulations.

FIG. 7 illustrates the scale of such intensity modulation as a function of phase difference between probe and reference beams. The dotted line 701 represents the ideal intensity pattern given by Equ.4 as a function of optical path difference (OPD) induced phase difference between the probe and reference beams. For the embodiment described in this invention, the probe beam is aligned along the optical axis of the imaging system while the reference beam can be moved from superimposed axial position to a few tens of microns away from the probe beam on DUT by turning the adjustable mirror 610 in the split beam module 606. The controlled angular beam deviations and the resultant split beam separation on DUT for different microscopic objectives in the optical system can be calibrated offline beforehand. In the case of, e.g., a PZT controlled mirror 610, the PZT controller output in volts can be used, instead, as a means to change phase, oscilloscope 550 together with a spectrum analyzer can be used to obtain the signal waveform amplitude and intensity profiles. The resultant signal as a function of split beam separation in terms of phase or PZT voltage is plotted that resembles the dotted sinusoidal curve 701 shown in FIG. 7.

Such an outcome of the technique should find some interesting applications where intensity modulations play an important criteria for decision making. It is evident that the phase parameter α is contributed by optical path difference between the split beams as well as voltage driven DUT features. Equ.(5) reveals the maximum sensitivity to phase variations when the phase difference (a) between the probe and reference beam is statically set to π/2 or its odd integral multiple and when the amplitudes of the two beams are the same or very close to the same value (i.e., m≅1). In FIG. 7, this is vividly illustrated for two separate split beam separations whose induced phase differences α are 7π/2 and 7π. The split beam separation corresponding to 7π/2 (an odd π/2 multiple) produces significantly enhanced signal modulation 702 for a small induced phase 703 compared to the modulation 704 produced by 7π(a π multiple) phase difference equivalent beam separation. So applications requiring detection of intensity variations may benefit from having such adjustable separation between the split beams. On a similar note, weakly activated nodes in an IC may be probed for maximum signal by adjusting the separation between the split beams for maximum intensity as given by Equ (4). This technique for maximum sensitivity in signal modulation offered by a split beam is of interest in many practical applications in IC fault analysis for efficiently probing even small electronic device nodes that are otherwise difficult to capture during signal mapping process. An interesting part of the waveform acquisition by oscilloscopes is the amplitude reversal with changes in phase induced by split beam separation that result in baseline intensity modulation as predicted by Equ. 4 and the dotted sinusoidal curve 701 in FIG. 7. Any additional phase contributions coming out of DUT induced phase from an activated node or device would result in altering the base waveform. This could be an additional debug or diagnostic tool in such applications.

It is useful to mention the various forms of phase that can influence the sinusoidal response expected in FIG. 7. Three examples of such cases, illustrated in FIGS. 8A-8C, are worthy of mention. In these illustrations the dotted line curve 801 represents the ideal sinusoidal curve solely accounted by the OPD induced phase difference of the split beam as per Equ 4, and the solid line curve 802 is the real performance curve due to the additional phase term influencing the 'cos' term. In reality, this additional phase term could be linear or non-linear depending on the application. FIG. 8A represents a simple addition or subtraction of a linear phase from DUT causing simple shift of the sinusoidal function. Non-linear phase terms, on the other hand, cause contraction or elongation of the split beam performance function along the phase axis as shown in FIG. 8B. Both linear and non-linear phase induction is common to probing applications. FIG. 8C illustrates phase aberrations induced by the optical design and assembly errors, causing the amplitude, intensity and thus contrast roll off for large split beam separations. It is important to note that the embodiment and the technique of the present disclosure provide a potentially valuable debugging tool for various applications where the deviation from the expected result is an important diagnostic piece of information.

The examples described in this disclosure may operate in a way that optimizes the signal beam modulation. For example, the split beam generator module 606 may be initially coarse adjusted and set for equal path lengths for probe and reference beams until an interference fringe pattern with maximum extinction ratio is obtained as scanned image of a plane mirror in place of the DUT 619. The adjustable mirror 610 can then be set to adjust the spatial and axial position of the probe and reference beam foci on DUT. Subsequent fine axial adjustments between probe and reference beams aid in maximizing the return power from the split beam on a voltage activated DUT. Furthermore, the flip-in and flip-out physical stops 613 and 614 offer additional control on optimizing the signal beam characteristics by working individually on each component of the split beam. The optimal phase difference α could be met by the axial translation settings on adjustable mirror 610. The final interfering probe and reference beams entering signal collection I/O module 601 are from the laser with same polarization, and hence can be adjusted for maximum extinction ratio suitable for maximizing the return signal. The condition for near equal amplitudes can be achieved by optimally dividing the power between the input beam components with polarization rotator 607.

Aspects of the present disclosure allow for split beam probing with flexible probe and/or reference beam placement, enhanced signal to noise ratio and decreased sampling time.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature described herein, whether preferred or not, may be combined with any other feature described herein, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed:

1. A system comprising:
    a split beam module configured to receive a linearly polarized input beam, wherein the split beam module is configured to rotate a polarization direction of the input beam to produce a polarization adjusted beam, split the input beam into first and second beams having orthogonal polarization, adjust a spatial separation between the input first and second beams, and independently adjust a relative phase difference between input first and second beams to produce phase-adjusted input first and second beams;
    imaging components optically coupled to the split beam module along an optical path at a location between the split beam module and a target, wherein the imaging components are configured to focus the phase-adjusted input first and second beams onto the target at corresponding spatially separated first and second locations and transmit portions of the phase adjusted input first and second beams reflected from the spatially separated first and second locations back into the split beam module,
    wherein the split beam module is further configured to recombine at least part of the portions of the phase adjusted input first and second beams reflected from the spatially separated first and second locations into a signal beam.

2. The system of claim 1, wherein the split beam module includes a rotatable half waveplate configured to adjust the polarization orientation of the polarized input beam for equal or adjustable split beam intensities on the target.

3. The system of claim 2, wherein the split beam module includes a polarization beam splitter configured to split the polarization adjusted beam into input probe and reference beams of orthogonal polarization.

4. The system of claim 3, wherein the split beam module includes a tip-tilt-piston adjustable mirror coupled to the polarization beam splitter, wherein the tip-tilt-piston adjustable mirror is configured to introduce the adjustable spatial separation between the input first and second beams, and adjust the phase difference between input first and second beams.

5. The system of claim 4, further comprising an I/O block optically coupled to the split beam module, wherein the I/O block is configured to receive the input beam and direct the input beam towards the split beam module.

6. The system of claim 5, wherein the I/O block is configured to receive the signal beam and direct the signal beam to an optical path towards a detector.

7. The system of claim 1, further comprising a scanner optically coupled to the split beam module, wherein the scanner is configured to scan the phase-adjusted input first and second beams with respect to the target.

8. The system of claim 7, wherein the scanner is configured to scan the phase-adjusted input first and second beams in unison with respect to the target.

9. The system of claim 1, wherein the split beam module further comprises first and second shutters configured to independently shutter the first and second beams, respectively.

10. An apparatus comprising:
a split beam module configured to receive a polarized input beam, adjust a polarization orientation of the polarized input beam to form a polarization adjusted input beam, split the polarization adjusted input beam into input first and second beams of orthogonal polarization, adjust a spatial separation between the input first and second beams, independently adjust a phase difference between the input first and second beams to produce phase-adjusted input first and second beams, transmit the phase-adjusted input first and second beams to imaging components optically coupled to the split beam module along an optical path at a location between the split beam module and a target, and receive reflected portions of the phase-adjusted input first and second beams from the imaging optics and recombine at least part of the reflected portions of the phase-adjusted input first and second beams into a signal beam.

11. The apparatus of claim 10, wherein the split beam module includes a rotatable half waveplate configured to adjust the polarization orientation of the polarized input beam.

12. The apparatus of claim 11, wherein the split beam module includes a polarization beam splitter configured to split the polarization adjusted input beam into the input probe and reference beams of orthogonal polarization.

13. The apparatus of claim 12, wherein the split beam module includes a tip-tilt-piston adjustable mirror coupled to the polarization beam splitter, wherein the tip-tilt-piston adjustable mirror is configured to introduce the adjustable spatial separation between the input first and second beams, and adjust the phase difference between the input first and second beams.

14. The apparatus of claim 13, wherein the tip-tilt-piston adjustable mirror is configured to receive the input first beam and reflect it back toward the polarization beam splitter.

15. The apparatus of claim 14, further comprising another mirror coupled to the polarization beam splitter, wherein the other mirror is configured to receive the input second beam and reflect it back toward the polarization beam splitter.

16. The apparatus of claim 15, further comprising a first polarization converting element optically coupled between the tip-tilt-piston mirror and the polarization beam splitter, wherein the first polarization converting element is configured to convert the input first beam received from the polarization beam splitter to an orthogonal polarization and transmit the input first beam with the orthogonal polarization back to the polarization beam splitter.

17. The apparatus of claim 15, further comprising a second polarization converting element optically coupled between the other mirror and polarization beam splitter, wherein the second polarization converting element is configured to convert the polarization of the input second beam received from the polarization beam splitter to an orthogonal polarization and transmit the input second beam with the orthogonal polarization back to the polarization beam splitter.

18. The apparatus of claim 10, wherein the split beam module further comprises first and second shutters configured to independently shutter the first and second beams, respectively.

19. A method comprising:
receiving a polarized input beam;
adjusting the polarization orientation of the polarized input beam to produce a polarization adjusted input beam;
splitting the polarization adjusted input beam into input first and second beams of orthogonal polarization;
introducing an adjustable spatial separation between the input first and second beams;
independently adjusting a phase difference between the input first and second beams to produce phase-adjusted input first and second beams;
focusing the phase-adjusted input first and second beams onto a target at corresponding spatially separated first and second locations after introducing the adjustable spatial separation between the input first and second beams;
recombining at least part of reflected portions of the phase-adjusted input first and second beams from the target into a signal beam; and
detecting an intensity modulation of the signal beam resulting from a phase difference between the reflected portions of the phase-adjusted input first and second beams.

20. The method of claim 19, wherein the first location corresponds to an inactive portion of a semiconductor device and the second location corresponds to an active portion of the semiconductor device.

21. The method of claim 19, wherein adjusting the phase difference between the first and second beams includes adjusting an induced phase difference due to an optical path difference between the first and second beams so that a total phase difference due to the induced phase difference and a phase difference due to probing the first and second locations with the first and second beams respectively meets a condition for maximum sensitivity of modulation of the signal beam.

22. The method of claim 19, further comprising adjusting a power of the input beam.

23. The method of claim 19, further comprising independently shuttering the input first and second beams.

* * * * *